(12) United States Patent
Horiuchi et al.

(10) Patent No.: US 9,880,471 B2
(45) Date of Patent: Jan. 30, 2018

(54) DEVELOPING SOLUTION PROCESSING DEVICE AND PROCESSING METHOD

(71) Applicant: TORAY INDUSTRIES, INC., Tokyo (JP)

(72) Inventors: Ken Horiuchi, Otsu (JP); Atsushi Kondo, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 353 days.

(21) Appl. No.: 14/412,139

(22) PCT Filed: Jul. 2, 2013

(86) PCT No.: PCT/JP2013/068087
§ 371 (c)(1),
(2) Date: Dec. 30, 2014

(87) PCT Pub. No.: WO2014/021043
PCT Pub. Date: Feb. 6, 2014

(65) Prior Publication Data
US 2015/0177622 A1    Jun. 25, 2015

(30) Foreign Application Priority Data
Aug. 3, 2012    (JP) .................. 2012-172559

(51) Int. Cl.
*G03F 7/32* (2006.01)
*G03F 7/30* (2006.01)
(Continued)

(52) U.S. Cl.
CPC ........... *G03F 7/32* (2013.01); *B01D 19/0052* (2013.01); *B01D 19/02* (2013.01); *B01D 21/26* (2013.01);
(Continued)

(58) Field of Classification Search
CPC ........ G03F 7/32; G03F 7/3092; B01D 21/26; B01D 21/262; B01D 21/267; B01D 19/02; B01D 19/0052
See application file for complete search history.

(56) References Cited

U.S. PATENT DOCUMENTS 7,326,353 B2 *    2/2008 Hendrickson .......... B01D 21/26
                                                              210/749

FOREIGN PATENT DOCUMENTS

CN    2188986 Y    2/1995
CN    102114360 A    7/2011
(Continued)

OTHER PUBLICATIONS

The Translation of the Written Opinion of the International Searching Authority for PCT/JP2013/068087, dated Sep. 3, 2013.*
(Continued)

*Primary Examiner* — David A Reifsnyder
(74) *Attorney, Agent, or Firm* — Birch, Stewart, Kolasch & Birch, LLP

(57) ABSTRACT

The purpose of the present invention is to provide a developing solution processing device and processing method that solve problems that accompany the occurrence of scum, improve product defect rate, increase the utilization ratio of manufacturing devices, and contribute considerably to reduced manufacturing costs and other factors through highly efficient recovery of noble metals. The present invention provides a developing solution processing device provided with: a centrifuge for separating a clarified liquid and a residue by centrifugally separating out developing solution after development processing; and a defoaming device for defoaming and discharging the clarified liquid.

12 Claims, 2 Drawing Sheets

(51) Int. Cl.
*B01D 21/26* (2006.01)
*B01D 19/00* (2006.01)
*B01D 19/02* (2006.01)

(52) U.S. Cl.
CPC ......... *B01D 21/262* (2013.01); *B01D 21/267* (2013.01); *G03F 7/3092* (2013.01)

(56) References Cited

FOREIGN PATENT DOCUMENTS

| | | |
|---|---|---|
| JP | S52-87712 U | 6/1977 |
| JP | 2000-155426 A | 6/2000 |
| JP | 2003-215810 A | 7/2003 |
| JP | 2005-148592 A | 8/2005 |
| JP | 2005-292189 A | 10/2005 |

OTHER PUBLICATIONS

International Search Report for PCT/JP2013/068087 dated Sep. 3, 2013.

* cited by examiner

DEVELOPING SOLUTION PROCESSING DEVICE AND PROCESSING METHOD

TECHNICAL FIELD

The present invention relates to a developing solution processing device and processing method.

BACKGROUND ART

The pattern refers to a shape of a specific material on a substrate, and for example, just paying attention to a backplate of a plasma display panel shows that an electrode, a partition wall and a fluorescent material each have a complicated pattern. Among these patterns, the conductive pattern refers to a shape of a conductive material on a substrate, and as a material for forming the conductive pattern, a non-fired type photosensitive conductive paste containing a conductive filler is known. A non-fired type photosensitive conductive paste exhibits conductivity as conductive fillers are brought into contact with each other by curing shrinkage in a curing step at a relatively low temperature, so that a conductive pattern can be formed on a film substrate etc. which is poor in heat resistance. For this reason, development has been advanced for fine pitch wirings of touch panels of smart phones and electronic boards (Patent Documents 1 to 5).

A conductive pattern formation process using a photosensitive conductive paste is a process in which a coated film etc. formed from a photosensitive conductive paste is exposed by applying light thereto through a photomask having a desired pattern, whereby a difference in solubility is generated in a developing solution, so that dissolved components are eluted in the developing solution to form a pattern. Thus, the conductive pattern formation process using a photosensitive conductive paste is absolutely required to include a development processing step using a developing solution.

In the developing solution after development processing, insoluble inorganic components and lumps of organic components remain as insoluble components. These insoluble components, i.e. residues are generated in a large amount in, for example, a process for forming a pattern of a partition wall on a plasma display panel backplate. For recycling a developing solution after development processing to subject the developing solution to development processing again, it is necessary to remove residues from the developing solution after development processing in order to prevent contamination of a development object, clogging of a development processing step device, and so on. On the other hand, a photosensitive conductive paste for forming, for example, an electrode pattern contains an expensive metal such as silver, and therefore separation of residues from a developing solution after development processing also has a meaning as resource recovery.

As a method for separating residues from a developing solution after development processing, a method using a filter or a settling tank is known, but the method has various problems such as high replacement frequency of filters, necessity to stop a device at the time of filter replacement, and necessity of a high-capacity settling tank for lowering a flow rate. Therefore, as a method to replace the above-mentioned method, a centrifugal separation method has been developed (Patent Documents 5 and 6).

PRIOR ART DOCUMENTS

Patent Documents

Patent Document 1: Japanese Patent Laid-open Publication No. 59-143149
Patent Document 2: Japanese Patent Laid-open Publication No. 5-75273
Patent Document 3: Japanese Patent Laid-open Publication No. 4034555
Patent Document 4: Japanese Patent Laid-open Publication No. 4319625
Patent Document 5: Japanese Patent Laid-open Publication No. 3191772
Patent Document 6: Japanese Patent Laid-open Publication No. 2005-292189

SUMMARY OF THE INVENTION

Problems to be Solved by the Invention

However, in separation of residues by the centrifugal separation method, inorganic components having a high specific gravity (about 10), such as silver, can be efficiently recovered, but removal efficiency of insoluble components such as organic substances having a low specific gravity is low, and a large amount of air is caught in a developing solution, so that these components are mixed in the developing solution and aggregated, leading to generation of scum as a suspended matter. The scum is easily generated particularly in a conductive pattern formation process using a non-fired type photosensitive conductive paste, and causes many problems such as pipe clogging by scum, malfunction of various kinds of sensors, and defects of conductive patterns after development processing.

Thus, an object of the present invention is to provide a developing solution processing device and processing method which significantly contribute to improvement of a product defect ratio, enhancement of an operating ratio of production equipment, reduction of production costs by recovery of novel metals with high efficiency, or the like by solving problems associated with generation of scum.

Solutions to the Problems

Thus, the present inventors have extensively conducted studies with a view of inhibiting generation of scum in the first place rather than removing generated scum, and resultantly found that combination of defoaming of a developing solution after development processing and flowing of the developing solution under certain conditions is extremely effective for inhibition of generation of scum, leading to completion of the present invention.

That is, the present invention provides the developing solution processing device and processing method described in (1) to (10) below.

(1) A developing solution processing device including: a centrifugal separator that separates a developing solution after development processing into a clear liquid and residues by centrifugal separation; and a defoaming device that defoams and discharges the clear liquid.

(2) The processing device according to (1), including: a centrifugal separator that centrifugally separates a developing solution after development processing to obtain a clear liquid and residues; a first tank that stores the clear liquid; a defoaming device that defoams and discharges the clear liquid in the first tank; a second tank that mixes the clear liquid discharged from the defoaming device and an unused developing solution, and stores the mixture; and means for supplying the clear liquid, which overflows out of the second tank, to the first tank from above the first tank.

(3) The processing device according to (1), including: a centrifugal separator that centrifugally separates a developing solution after development processing to obtain a clear liquid and residues; a first tank that stores the clear liquid; a defoaming device that defoams and discharges the clear liquid in the first tank; a second tank that mixes the clear liquid discharged from the defoaming device and an unused developing solution, and stores the mixture; and means for supplying the clear liquid, which overflows out of the first tank, to the second tank from above the second tank.

(4) The processing device according to (2) or (3), wherein the first tank and the second tank are adjacent to each other with a partition plate held therebetween.

(5) The processing device according to any one of (2) to (4), wherein the clear liquid overflowing out of the first tank or the second tank flows along the partition plate and is supplied to the other tank.

(6) The processing device according to any one of (2) to (5), wherein a height difference between a level of the clear liquid stored in the first tank and a level of the clear liquid stored in the second tank is 5 cm or more.

(7) The processing device according to any one of (2) to (6), wherein a flow rate in a vertical direction of the clear liquid supplied from above the first tank or the second tank is 15 cm/s or more.

(8) The processing device according to any one of (2) to (7), wherein an air bubble ratio of the clear liquid discharged from the defoaming device is 10% or less.

(9) A developing solution processing method including: a centrifugal separation step of centrifugally separating a developing solution after development processing to obtain a clear liquid and residues; and a defoaming step of defoaming the clear liquid to obtain a defoamed developing solution.

(10) The processing method according to (9), including: a mixing step of mixing the defoamed developing solution and an unused developing solution to obtain a mixed developing solution; and a reflux step of supplying a part of the mixed developing solution to the development processing, and supplying a part of the mixed developing solution to the defoaming step from above the clear liquid before the defoaming.

Effects of the Invention

According to a developing solution processing device of the present invention, generation of scum can be significantly inhibited, so that improvement of a product defect ratio, enhancement of an operating ratio of production equipment, reduction of production costs by recovery of novel metals with high efficiency, or the like can be achieved.

EMBODIMENTS OF THE INVENTION

A developing solution processing device of the present invention includes: a centrifugal separator that separates a developing solution after development processing into a clear liquid and residues by centrifugal separation; and a defoaming device that defoams and discharges the clear liquid.

A developing solution processing method of the present invention includes: a centrifugal separation step of separating a developing solution after development processing into a clear liquid and residues by centrifugal separation; and a defoaming step of defoaming the clear liquid to obtain a defoamed developing solution.

When a developing solution after development processing is recycled, it is preferred that the total amount thereof is supplied to a centrifugal separator, and the resulting clear liquid is recycled as a developing solution from the viewpoint of prevention of generation of scum, efficient separation of residues and improvement of a clarification degree of the clear liquid.

Figure 2:
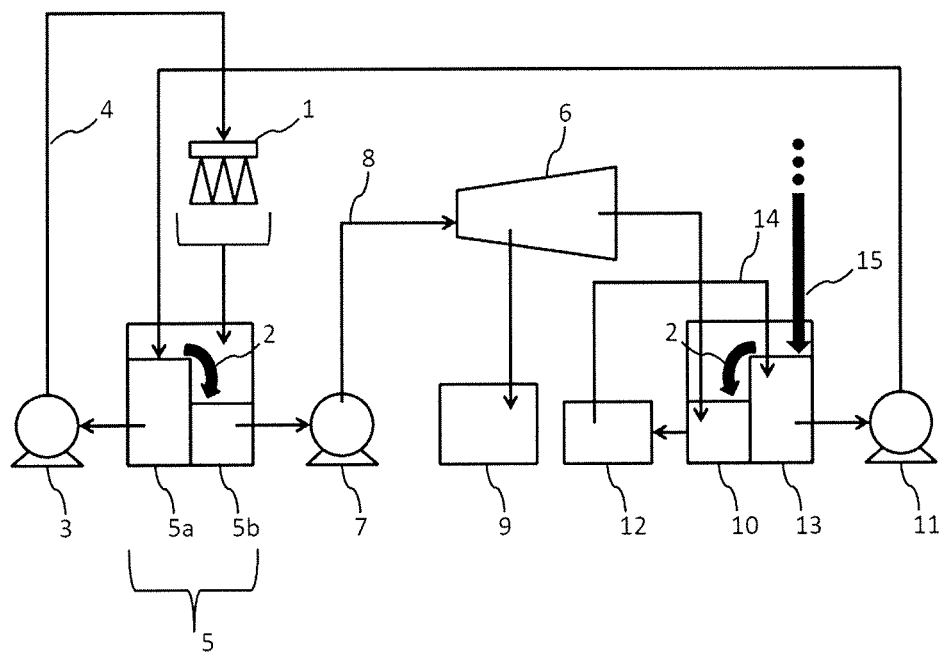
FIG. 2 is a schematic view showing a development processing step using a developing solution processing device according to a first embodiment of the present invention.

A processing device according to a first embodiment of the present invention as shown in FIG. 2 includes: a centrifugal separator that centrifugally separates a developing solution after development processing to obtain a clear liquid and residues; a first tank that stores the clear liquid; a defoaming device that defoams and discharges the clear liquid in the first tank; a second tank that mixes the clear liquid discharged from the defoaming device and an unused developing solution, and stores the mixture; and means for supplying the clear liquid, which overflows out of the second tank, to the first tank from above the first tank.

Figure 3:
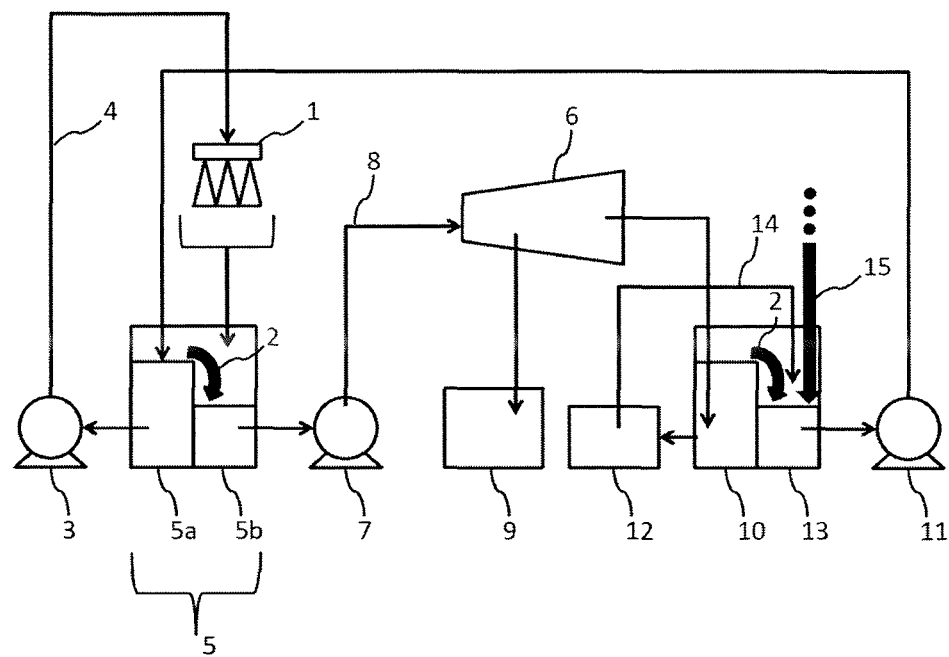
FIG. 3 is a schematic view showing a development processing step using a developing solution processing device according to a second embodiment of the present invention.

A developing solution processing device according to a second embodiment of the present invention as shown in FIG. 3 includes: a centrifugal separator that centrifugally separates a developing solution after development processing to obtain a clear liquid and residues; a first tank that stores the clear liquid; a defoaming device that defoams and discharges the clear liquid in the first tank; a second tank that mixes the clear liquid discharged from the defoaming device and an unused developing solution, and stores the mixture; and means for supplying the clear liquid, which overflows out of the first tank, to the second tank from above the second tank.

Figure 4:
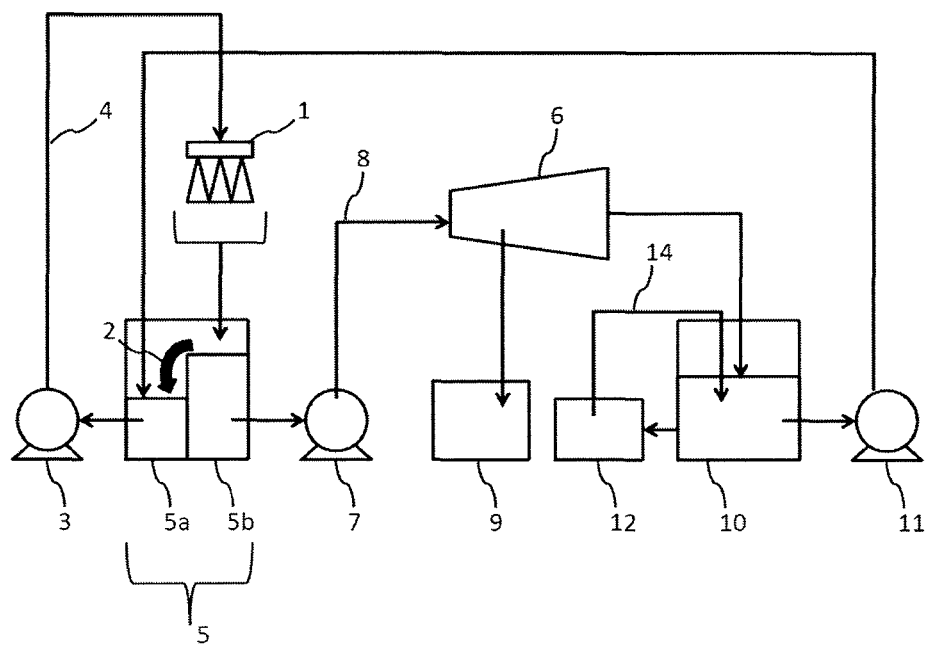
FIG. 4 is a schematic view showing a development processing step using a developing solution processing device according to a third embodiment of the present invention.

A developing solution processing device according to a third embodiment of the present invention as shown in FIG. 4 includes: a centrifugal separator that separates a developing solution after development processing into a clear liquid and residues by centrifugal separation; and a defoaming device that defoams and discharges the clear liquid.

The "centrifugal separation" is a method in which by using a difference in specific gravity between residues that are solids, i.e. insoluble components in a developing solution, and the developing solution, residues and the developing solution are separated by means of a centrifugal force to obtain a clear liquid with residues removed from the developing solution. In other words, the clear liquid is a developing solution freed of residues. The clear liquid may contain insoluble components such as organic substances, which are exemplified by organic particles that cannot be completely separated by means of a centrifugal force. On the other hand, residues generally have inorganic particles as a main component.

The device that achieves the centrifugal separation in a mechanical manner is a centrifugal separator, and a decanter type centrifugal separator is preferred because continuous processing is possible.

When separated residues contain a noble metal such as silver as inorganic particles, production costs can be reduced by melting and recovering these inorganic particles. The developing solution processing device of the present invention is suitable for recovery of residues containing metal particles as inorganic particles, and it is more preferred that the metal particles are particles of a noble metal selected from the group consisting of Ag, Au, Cu, Pt, Pb, Sn, Ni, Al, W, Mo, ruthenium oxide, Cr, Ti and indium from the viewpoint of reduction of production costs.

When inorganic particles to be separated as residues cannot be completely separated by means of a centrifugal force, and are mixed in a clear liquid, scum is easily generated with the inorganic particles forming nuclei.

The clear liquid obtained by centrifugal separation is supplied to the first tank and stored therein. The clear liquid supplied to the first tank has an extremely high air bubble ratio with a large amount of air caught by centrifugal separation. When air bubbles in the liquid ascend to the liquid level, insoluble components such as organic substances having a low specific gravity ascend to the liquid level along with air bubbles, and aggregated and suspended, leading to generation of scum. Thus, the air bubble ratio of the clear liquid stored in the first tank is preferably low.

The air bubble ratio can be calculated from the following formula (1) after a liquid to be measured is taken in a measuring cylinder, and a volume (L1) of a part that contains air bubbles and a volume (L2) of a part that does not contain air bubbles are each measured.

[Formula 1]

$$\text{Air bubble ratio} = L1/(L1+L2) \qquad (1)$$

The developing solution processing device according to the third embodiment of the present invention includes a defoaming device that defoams and discharges a clear liquid.

The developing solution processing device according to the first embodiment or second embodiment of the present invention includes a defoaming device that defoams and discharges a clear liquid in the first tank for reducing the air bubble ratio of the clear liquid stored in the first tank. Examples of the defoaming device include defoaming pumps or hollow yarn membrane degassing modules by heating boiling degassing, ultrasonic wave degassing, evacuation degassing or centrifugal degassing, or combinations thereof.

The air bubble of the clear liquid obtained by centrifugal separation is often more than 50%, but the air bubble ratio of the clear liquid after defoaming processing by the defoaming device is preferably 10% or less, more preferably 5% or less.

The clear liquid obtained by centrifugal separation is supplied to the first tank in the developing solution processing device according to the first embodiment or second embodiment of the present invention. The clear liquid after defoaming processing is supplied to the second tank and stored therein in the developing solution processing device according to the first embodiment or second embodiment of the present invention. Separately an unused developing solution is supplied to the second tank. That is, in the second tank, the clear liquid after defoaming processing and the unused developing solution are mixed and stored. The supply amount (flow rate etc.) of the unused developing solution supplied to the second tank may be appropriately determined while the balance of liquid flow in the whole of the processing device of the present invention is taken into consideration. The "unused developing solution" is a convenient term that refers discriminately to a developing solution having an origin different from that of the clear liquid after defoaming processing, and is not limited to a developing solution that is not used at all for development processing in the strict sense. That is, the unused developing solution may be a used (recycles) developing solution etc. which is refined by means different from the processing device of the present invention.

The developing solution processing device according to the first embodiment of the present invention includes means for supplying a clear liquid, which overflows out of the second tank, to the first tank from above the first tank. On the other hand, the developing solution processing device according to the second embodiment of the present invention includes means for supplying a clear liquid, which overflows out of the first tank, to the second tank from above the second tank.

As means for supplying a clear liquid, which overflows out of the first tank or the second tank, to the other tank, for example, a pipe is provided between the first tank and the second tank, but from the viewpoint of space saving, simplification of a processing device structure, and so on, it is preferred that as shown in FIGS. 2 and 3, the first tank and the second tank are made adjacent to each other with a partition plate held therebetween, and the clear liquid overflowing out of the first tank or the second tank is made to flow along the partition plate.

In the processing device of the present invention, it is preferred that a flow for suppressing a situation in which insoluble components in the clear liquid stored in the first tank ascends to the liquid level is imparted to the clear liquid in the first tank in combination with defoaming processing by the defoaming device.

More specifically, by supplying a liquid from above the clear liquid stored in the first tank, a flow can be produced for suppressing a situation in which insoluble components in the clear liquid ascend to the liquid level. In the developing solution processing device according to the first embodiment of the present invention, the liquid supplied from above the first tank is a clear liquid overflowing out of the second tank as shown in FIG. 2. In the developing solution processing device according to the second embodiment of the present invention, the liquid supplied from above the first tank is a clear liquid after centrifugal separation as shown in FIG. 3.

A height difference between a level of the clear liquid stored in the first tank and a level of the clear liquid stored in the second tank is preferably 5 cm or more. In this case, the capacity of each of the first tank and the second tank is preferably about 100 to 300 L. As a height difference between liquid levels of growth liquids in both tanks becomes greater, potential energy of the clear liquid overflowing out of one of the tanks increases. As a result, kinetic energy at the time when the clear liquid flows into the other tank also increases, so that ascending insoluble components can be made finer.

Many of air bubbles as air caught by the clear liquid stored in the first tank have a diameter of about 0.5 mm. The speed at which an air bubble having such a size ascends toward the liquid level is about 15 cm/s, and therefore the flow rate in a vertical direction of an overflow stream supplied from above the first tank or the second tank is preferably 15 cm/s or more, more preferably 20 cm/s or more. The term "from above" includes not only "from above in a vertical direction" but also "from above in an oblique direction". Here, when the overflow stream is supplied from above in an oblique direction, the flow rate of the overflow stream in a vertical direction can be determined by resolving the flow rate in an oblique direction into a flow rate in the vertical direction and a flow rate in the horizontal direction as a rate vector. For more effectively suppressing generation of scum, the developing solution processing device according to the first embodiment of the present invention in which a clear liquid after defoaming processing by the defoaming device is made to overflow is preferred.

It is preferred that the concentration of a developing solution processed by the processing device of the present invention is regularly corrected. Examples of the device for measuring a concentration of a developing solution include a pH meter, an electric conductivity meter and an automatic titrator. Examples of the method for adjusting a concentration of a developing solution include a method in which a predetermined amount of an unused high-concentration developing solution is added in a system of a processing device.

The developing solution processing device of the present invention can be suitably used in a development processing step in a pattern formation process in which a photosensitive paste formed of an organic component containing a photosensitive component is applied onto a substrate, exposed and developed to form a desired pattern, more preferably a conductive pattern formation process using a photosensitive conductive paste. Particularly, use of the developing solution processing device in a development processing step in a conductive pattern formation process using a non-fired type photosensitive conductive paste with which scum is particularly easily generated is preferred because the effect of the device can be remarkably exhibited.

Examples of the method for development processing include alkali development and organic development.

Examples of the developing solution to be used for alkali development include aqueous solutions of tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine and hexamethylenediamine, and a polar solvent such as N-methyl-2-pyrrolidone, N,N-dimethylformamide, N,N-dimethylacetamide, dimethylsulfoxide or γ-butyrolactone, an alcohol such as methanol, ethanol or isopropanol, an ester such as ethyl lactate or propylene glycol monomethyl ether acetate, a ketone such as cyclopentanone, cyclohexanone, isobutyl ketone or methyl isobutyl ketone, or a surfactant may be added. Examples of the developing solution to be used for organic development include polar solvents such as N-methyl-2-pyrrolidone, N-acetyl-2-pyrrolidone, N,N-dimethylacetamide, N,N-dimethylformamide, dimethyl sulfoxide and hexamethylphosphortriamide alone, and a mixed solutions with the polar solvent combined with methanol, ethanol, isopropyl alcohol, xylene, water, methyl carbitol, ethyl carbitol or the like.

Examples of the non-fired type photosensitive conductive paste include those obtained by dispersing a conductive filler (D) in a photosensitive resin formed by mixing a compound (A) having an alkoxy group, a photosensitive component (B) and a photopolymerization initiator (C).

Examples of the compound (A) having an alkoxy group include N-methoxymethylacrylamide, N-ethoxymethylacrylamide, N-n-butoxymethylacrylamide.

The photosensitive component (B) refers to a monomer, oligomer or polymer having at least one unsaturated double bond in the molecule, and preferably includes an alkali-soluble polymer when development processing is alkali development.

Examples of the alkali-soluble polymer include acryl-based copolymers. The acryl-based copolymer refers to a copolymer including an acryl-based monomer such as methyl acrylate, acrylic acid, 2-ethylhexyl acrylate, ethyl methacrylate or n-butyl acrylate in a copolymerization component.

The photopolymerization initiator (C) refers to a compound which absorbs short-wavelength light such as ultraviolet rays, and is decomposed to generate radicals, and examples thereof include 1,2-octanedione, 1-[4-(phenylthio)-2-(O-benzoyloxime)] or 2,4,6-trimethylbenzoyl-diphenyl-phosphine oxide. Along with the photopolymerization initiator (C), a sensitizer may be added to improve the sensitivity and expand the range of wavelengths effective for reaction. Examples of the sensitizer include 2,4-diethylthioxanthone, isopropylthioxanthone and 2,3-bis(4-diethylaminobenzal)cyclopentanone.

The conductive filler (D) contains preferably Ag, Au, Cu, Pt, Pb, Sn, Ni, Al, W, Mo, ruthenium oxide, Cr, Ti or indium, more preferably Ag from the viewpoint of costs and stability.

The non-fired type photosensitive conductive paste may contain an epoxy resin, and the epoxy equivalent of the epoxy resin is preferably 200 to 500 g/equivalent because storage stability of a coated film and adhesion of a conductive pattern are improved. The epoxy equivalent refers to a mass of an epoxy resin containing 1 equivalent of epoxy groups, and can be determined by the potentiometric titration method described in JIS-K7236.

The added amount of the epoxy resin is preferably 1 to 100 parts by weight, more preferably 30 to 80 parts by weight based on 100 parts by weight of the photosensitive component (B).

Examples of the photosensitive component (B) having an epoxy equivalent of 200 to 500 g/equivalent include ethylene glycol-modified epoxy resins, bisphenol A-type epoxy resins and brominated epoxy resins.

EXAMPLES

The present invention will be described in detail below by way of examples and comparative examples, but the aspect of the present invention is not limited to these examples.

(Preparation of Non-Fired Type Photosensitive Conductive Paste)

In a 100 mL clean bottle were added 20 g of a photosensitive component (B-1), 12 g of N-n-butoxymethylacrylamide, 4 g of a photopolymerization initiator (OXE-01; manufactured by Ciba Japan K.K.), 0.6 g of an acid generating agent (SI-110; manufactured by SANSHIN CHEMICAL INDUSTRY CO., LTD.) and 10 g of γ-butyrolactone (manufactured by Mitsubishi Gas Chemical Company, Inc.), and the mixture was mixed by Awatori Rentaro (registered trademark) (ARE-310; manufactured by THINKY CORPORATION) to obtain 46.6 g of a photosensitive resin solution A (solid content: 78.5% by weight). Using a three-roll roller (EXAKT M-50; manufactured by EXAKT Company), 8.0 g of the photosensitive resin solution A and 42.0 g of silver particles (average particle size: 2 μm) were kneaded to obtain 50 g of a non-fired type photosensitive conductive paste A.

The photosensitive component (B-1) is one obtained by addition reaction of 5 parts by weight of glycidyl methacrylate (GMA) with a copolymer of ethyl acrylate (EA)/2-ethylhexyl methacrylate (2-EHMA)/styrene (St)/acrylic acid (AA) (copolymerization ratio: 20 parts by weight/40 parts by weight/20 parts by weight/15 parts by weight). The photosensitive component (B-1) was synthesized in the following manner.

In a reaction vessel in a nitrogen atmosphere was added 150 g of diethylene glycol monoethyl ether acetate, and the temperature was elevated to 80° C. using an oil bath. To this was added dropwise for 1 hour a mixture including 20 g of ethyl acrylate, 40 g of 2-ethylhexyl methacrylate, 20 g of styrene, 15 g of acrylic acid, 0.8 g of 2,2'-azobisisobutyronitrile and 10 g of diethylene glycol monoethyl ether acetate. After completion of the dropwise addition, further a polymerization reaction was carried out for 6 hours. Thereafter, 1 g of hydroquinone monomethyl ether was added to stop the polymerization reaction. Subsequently, a mixture including 5 g of glycidyl methacrylate, 1 g of triethyl benzyl ammonium chloride and 10 g of diethylene glycol monoethyl ether acetate was added dropwise for 0.5 hours. After completion of the dropwise addition, further an addition reaction was carried out for 2 hours. The obtained reaction solution was refined with methanol to remove unreacted impurities, and dried under vacuum for 24 hours to obtain a photosensitive component (B-1). The obtained photosensitive component (B-1) had an acid value of 103 mg KOH/g and a glass transition temperature of 21.7° C. as determined from the formula (2).

[Formula 1]

$$\frac{1}{Tg} = \frac{W1}{T1} + \frac{W2}{T2} + \frac{W3}{T3} + \ldots \quad (2)$$

Here, Tg represents a glass transition temperature (unit: K) of a polymer, T1, T2, T3 . . . represent glass transition temperatures (unit: k) of homopolymers of monomer 1, monomer 2, monomer 3 . . . , respectively, and W1, W2, W3 . . . represent weight-based copolymerization ratios of monomer 1, monomer 2 and monomer 3 . . . , respectively.

(Formation of Coated Film-Exposure-Development Processing)

Onto a glass substrate, 40 g of a non-fired type photosensitive conductive paste A was applied with ITO by screen printing, and pre-baked at 100° C. for 10 minutes. Next, the paste was exposed over the entire line at an exposure amount of 70 mJ/cm² (in terms of a wavelength of 365 nm) using exposure equipment (PEM-6M; manufactured by UNION OPTICAL CO., LTD.). Total 1000 sheets of the coated film exposed over the entire line were prepared. Thereafter, using the developing solution processing device of the present invention, development processing was performed for 1 minute for one sheet of the coated film exposed over the entire line. An interval of 80 seconds was provided between development processing and next development processing.

(Evaluation of Conductive Pattern etc. after Development Processing)

The coated film after development processing was rinsed with ultrapure water, and then cured in a drying oven at 200° C. for 1 hour to obtain a conductive pattern having a film thickness of 10 μm. A line-and-space (hereinafter, referred to as "L/S") pattern of the conductive pattern was observed with an optical microscope. A resistivity and flexibility (presence/absence of cracking, line breakage and the like after the test) of the conductive pattern were checked.

Example 1

A developing solution processing device according to the first embodiment of the present invention as shown in FIG. 2 was constructed, and a developing solution, i.e. a 0.5% aqueous sodium carbonate solution was processed.

Specifically, nozzles were installed downward at intervals of 150 mm for one shower pipe as a developing device (1). The developing solution was sprayed from the nozzles to a development object (coated film exposed over the entire line as described above) moving at a constant speed below the developing device (1). The used developing solution used for development processing was collected and stored in a tank (5b). The tank (5b) is one compartment of a used developing solution tank (5) partitioned into two compartments by a partition plate. As the used developing solution tank (5), one which was partitioned into two compartments: tank (5a) and tank (5b) each having a capacity of 150 L and which had a total capacity of 300 L, was used. The temperature of the developing solution in the used developing solution tank (5) was controlled while the developing solution was stirred.

The used developing solution stored in the tank (5b) was supplied to a decanter type centrifugal separator (6) at a flow rate (q1) of 65 L/min via a supply pump Y (7) and liquid feeding means Y (8). The centrifugal separator (6) has SUS 304 as a main constituent material, and is subjected to wear resistance processing by attaching a WC chip to the tip of a screw conveyor which is heavily worn.

A clear liquid and residues were obtained by processing using the centrifugal separator (6). The clear liquid was supplied to a first tank (10), and the residues were supplied to a solid storage tank (9).

The clear liquid stored in the first tank (10) was supplied to a defoaming device, i.e. a deforming pump (12) (Model UPSA-1010S; manufactured by Yokota Manufacturing Co., Ltd.+vacuum pump (maximum displacement: 300 m³/Hr; ultimate pressure: 17 Torr) at a flow rate (q2) of 68 L/min, and the defoamed developing solution discharged after defoaming was supplied to a second tank (13) via liquid feeding means (14).

The air bubble ratio of the defoamed developing solution discharged after defoaming was 5% at a steady state. The SS concentration (JIS K0102) was measured to be 0.03 g/L.

The clear liquid stored in the second tank (13) was supplied to the tank (5a) at 65 L/min, a flow rate equal to the flow rate (q1), by a supply pump Z (11). The clear liquid overflowing out of the tank (5a) was caused to flow in from above the tank (5b) as an overflow stream.

The clear liquid stored in the tank (5a) was supplied as a recycled developing solution at a flow rate (Q) of 60 L/min to the developing device (1) via a supply pump X(3) and liquid feeding means X(4).

As a result of having the configuration described above, the clear liquid overflowed out of the second tank (13), and flowed in from above the first tank (10) as an overflow steam. A height difference between a level of the clear liquid stored in the first tank (10) and a level of the clear liquid stored in the second tank (13) was 5 cm. The flow rate of the overflow stream in the vertical direction was measured to be 15 cm/s.

The developing solution in the processing device was constantly subjected to concentration control using an automatic titrator (Electrochemistry Systems 1036D), and was replaced by an unused developing solution at a flow rate of 3 L/min in the first tank (10), so that a set concentration (0.5%) was maintained.

The finally obtained conductive pattern was free from residues between patterns and pattern peeling up to the L/S of 20/20 μm, and the resistivity of the conductive pattern was $7.3\times10^{-5}$ Ωcm. Thus, good pattern processing was performed. For flexibility, cracking, line breakage and the like did not occur after the test, and good results were obtained. The product defect ratio was 0%.

The residues stored in the solid storage tank (9) contained little water, and 3.9 kg of a silver powder could be recovered (recovery rate 99%).

As a result of repeating a series of operations every day, pipe clogging (exceeding of discharge pressure upper limit of supply pump X (3)) did not occur over 30 days, during which maintenance of pipes was unnecessary.

Example 2

Similarly to Example 1, a developing solution processing device according to the first embodiment of the present invention as shown in FIG. 2 was constructed, and a developing solution was processed. However, the flow rate (q2) was changed to 70 L/min.

As a result, the clear liquid overflowed out of the second tank (13), and flowed in from above the first tank (10) as an overflow steam. A height difference between a level of the clear liquid stored in the first tank (10) and a level of the clear liquid stored in the second tank (13) was 7 cm. The flow rate of the overflow stream in the vertical direction was measured to be 20 cm/s.

The air bubble ratio of the defoamed developing solution discharged after defoaming was 3% at a steady state. The SS concentration was 0.01 g/L.

The finally obtained conductive pattern was free from residues between patterns and pattern peeling up to the L/S of 20/20 μm, and the resistivity of the conductive pattern was $7.3\times10^{-5}$ Ωcm. Thus, good pattern processing was performed. For flexibility, cracking, line breakage and the like did not occur after the test, and good results were obtained. The product defect ratio was 0%.

The residues stored in the solid storage tank (9) contained little water, and 3.9 kg of a silver powder could be recovered (recovery rate 99%).

As a result of repeating a series of operations every day, pipe clogging did not occur over 180 days, during which maintenance of pipes was unnecessary.

Example 3

A developing solution processing device according to the second embodiment of the present invention as shown in FIG. 3 was constructed, and a developing solution was processed in the same manner as in Examples 1 and 2. However, as the substrate, one obtained by attaching to a glass substrate a polyimide film having a film thickness of 50 μm was used, and the flow rate (q2) was changed to 55 L/min.

As a result of making the change described above, the clear liquid overflowed out of the first tank (10), and flowed in from above the second tank (13) as an overflow steam. A height difference between a level of the clear liquid stored in the first tank (10) and a level of the clear liquid stored in the second tank (13) was 7 cm. The flow rate of the overflow stream in the vertical direction was measured to be 20 cm/s.

The air bubble ratio of the defoamed developing solution discharged after defoaming was 10% at a steady state. The SS concentration was 0.05 g/L.

The finally obtained conductive pattern was free from residues between patterns and pattern peeling up to the L/S of 20/20 μm, and the resistivity of the conductive pattern was $7.3\times10^{-5}$ Ωcm. Thus, good pattern processing was performed. For flexibility, cracking, line breakage and the like did not occur after the test, and good results were obtained. The product defect ratio was 0%.

The residues stored in the solid storage tank (9) contained little water, and 3.9 kg of a silver powder could be recovered (recovery rate 99%).

As a result of repeating a series of operations every day, pipe clogging did not occur over 14 days, during which maintenance of pipes was unnecessary.

Example 4

A developing solution processing device shown in FIG. 4 was constructed. Tanks were united into the first tank (10), and the defoaming pump (12) and liquid feeding means Z (14) were provided. The flow rate (q1) was changed to 30 L/min, and the flow rate (q2) was changed to 55 L/min. The air bubble ratio of the defoamed developing solution discharged after defoaming was 10% at a steady state. The SS concentration was 0.1 g/L.

The finally obtained conductive pattern was free from residues between patterns and pattern peeling up to the L/S of 20/20 μm, and the resistivity of the conductive pattern was $7.3\times10^{-5}$ Ωcm. Thus, good pattern processing was performed. For flexibility, cracking, line breakage and the like did not occur after the test, and good results were obtained. The product defect ratio was 0%.

The residues stored in the solid storage tank (9) contained little water, and 3 kg of a silver powder could be recovered (recovery rate 76%).

As a result of repeating a series of operations every day, pipe clogging did not occur over 7 days, during which maintenance of pipes was unnecessary.

Comparative Example

Figure 1:
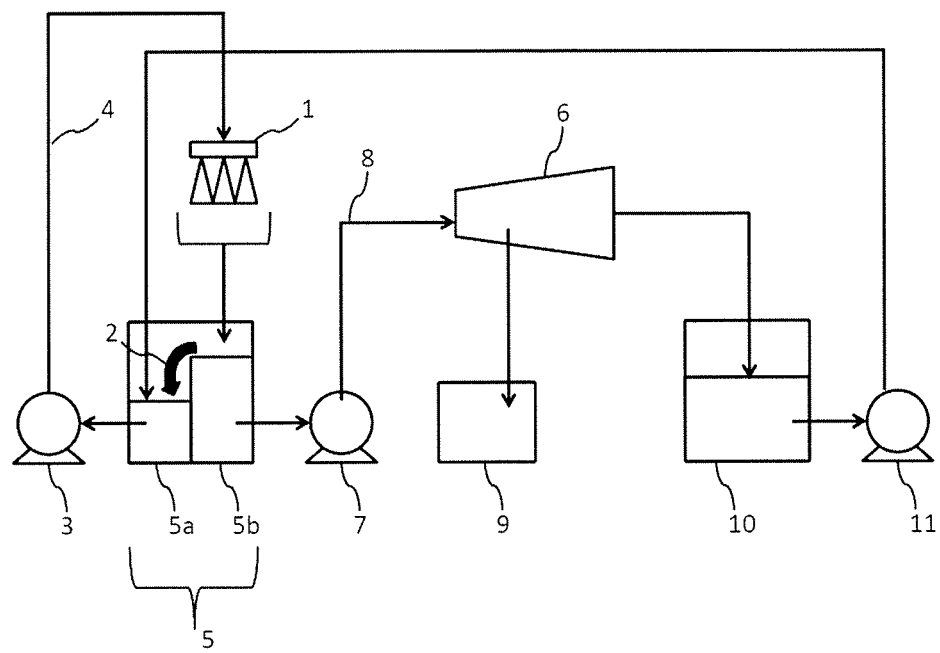
FIG. 1 is a schematic view showing a development processing step using a conventional developing solution processing device.

A developing solution processing device shown in FIG. 1 was constructed. That is, tanks were united into the first tank (10) rather than being discriminated as the first tank and the second tank as in FIGS. 2 and 3, and the defoaming pump (12) and liquid feeding means Z (14) were not provided. The flow rate (q1) was 30 L/min.

In the processing device which had no defoaming device and in which an overflow stream of the clear liquid in centrifugal separation was not generated, pipe clogging occurred just after about the half of total 1000 sheets of the coated film exposed over the entire line were subjected to development processing, so that maintenance of pipes etc. were unavoidable.

Coated film after development processing.

DESCRIPTION OF REFERENCE SIGNS

1: Developing device
2: Overflow stream
3: Supply pump X
4: Liquid feeding means X
5: Used developing solution tank 5a, 5b Tank (one compartment of used developing solution tank)
6: Centrifugal separator
7: Supply pump Y
8: Liquid feeding means Y
9: Solid storage tank
10: First tank
11: Supply pump Z
12: Defoaming pump
13: Second tank
14: Liquid feeding means Z
15: Unused developing solution

INDUSTRIAL APPLICABILITY

The developing solution processing device and processing method of the present invention can be suitably used in a development processing step in a conductive pattern formation process using a non-fired type photosensitive conductive paste.

The invention claimed is:

1. A developing solution processing device comprising:
  a centrifugal separator that separates a developing solution after development processing into a clear liquid and residues by centrifugal separation and that discharges the clear liquid into a first tank that stores the clear liquid;
  a defoaming device that defoams and discharges the clear liquid from the first tank;
  a second tank that mixes the clear liquid discharged from the defoaming device and an unused developing solution, and stores the mixture; and
  means for supplying the clear liquid, which overflows out of the second tank to the first tank from above the first tank, wherein the level of the clear liquid in the second tank is higher than the level of the clear liquid stored in the first tank by 5 cm or more.

2. The processing device according to claim 1, wherein the first tank and the second tank are adjacent to each other with a partition plate held therebetween.

3. The processing device according to claim 1, wherein the clear liquid overflowing out of the first tank or the second tank flows along the partition plate and is supplied to the other tank.

4. The processing device according to claim 1, wherein the clear liquid is supplied from above the first tank or the second tank at a flow rate in a vertical direction of 15 cm/s or more.

5. The processing device according to claim 1, wherein the clear liquid is discharged from the defoaming device with an air bubble ratio that of the clear liquid discharged from the defoaming device is 10% or less.

6. A developing solution processing device comprising:
  a centrifugal separator that separates a developing solution after development processing into a clear liquid and residues by centrifugal separation and that discharges the clear liquid into a first tank that stores the clear liquid;
  a defoaming device that defoams and discharges the clear liquid from the first tank;
  a second tank that mixes the clear liquid discharged from the defoaming device and an unused developing solution, and stores the mixture; and
  means for supplying the clear liquid, which overflows out of the first tank to the second tank from above the second tank, wherein the level of the clear liquid in the second tank is higher than the level of the clear liquid stored in the first tank by 5 cm or more.

7. The processing device according to claim 6, wherein the first tank and the second tank are adjacent to each other with a partition plate held therebetween.

8. The processing device according to claim 6, wherein the clear liquid overflowing out of the first tank or the second tank flows along the partition plate and is supplied to the other tank.

9. The processing device according to claim 6, wherein the clear liquid is supplied from above the first tank or the second tank at a flow rate in a vertical direction of 15 cm/s or more.

10. A developing solution processing method comprising:
  a centrifugal separation step of centrifugally separating a developing solution after development processing to obtain a clear liquid and residues; and
  a defoaming step of defoaming the clear liquid to obtain a defoamed developing solution, wherein the developing solution processing device of claim 6 is employed.

11. A developing solution processing method comprising:
  a centrifugal separation step of centrifugally separating a developing solution after development processing to obtain a clear liquid and residues; and
  a defoaming step of defoaming the clear liquid to obtain a defoamed developing solution, wherein the developing solution processing device of claim 1 is employed.

12. A developing solution processing method, comprising:
  a centrifugal separation step of centrifugally separating a developing solution after development processing to obtain a clear liquid and residues;
  a defoaming step of defoaming the clear liquid to obtain a defoamed developing solution;
  a mixing step of mixing the defoamed developing solution and an unused developing solution to obtain a mixed developing solution; and
  a reflux step of supplying a part of the mixed developing solution to the development processing, and supplying a part of the mixed developing solution to the defoaming step from above the clear liquid before the defoaming.

* * * * *